(12) United States Patent
Yokoyama

(10) Patent No.: US 7,352,582 B2
(45) Date of Patent: Apr. 1, 2008

(54) REINFORCING STRUCTURE, DISPLAY DEVICE, AND ELECTRONIC APPARATUS

(75) Inventor: Osamu Yokoyama, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 128 days.

(21) Appl. No.: 10/961,198

(22) Filed: Oct. 12, 2004

(65) Prior Publication Data

US 2005/0117293 A1 Jun. 2, 2005

(30) Foreign Application Priority Data

Oct. 14, 2003 (JP) ............................. 2003-353646
Aug. 24, 2004 (JP) ............................. 2004-243222

(51) Int. Cl.
*H05K 7/20* (2006.01)

(52) U.S. Cl. .................... 361/703; 361/687; 361/697

(58) Field of Classification Search ................ 361/697, 361/687, 703
See application file for complete search history.

(56) References Cited

U.S. PATENT DOCUMENTS

| | | | | |
|---|---|---|---|---|
| 4,039,890 | A | * | 8/1977 | Bailey et al. ............... 313/500 |
| 4,574,330 | A | * | 3/1986 | Cohen et al. ............... 361/681 |
| 5,255,109 | A | * | 10/1993 | Klein .......................... 349/84 |
| 5,383,340 | A | * | 1/1995 | Larson et al. .............. 62/259.2 |
| 5,606,341 | A | * | 2/1997 | Aguilera ..................... 345/87 |
| 5,748,269 | A | * | 5/1998 | Harris et al. ................. 349/58 |
| 5,990,615 | A | * | 11/1999 | Sakaguchi et al. .......... 313/504 |
| 6,052,280 | A | * | 4/2000 | Dilley et al. ................ 361/687 |
| 6,275,220 | B1 | * | 8/2001 | Nitta .......................... 345/204 |
| 6,324,055 | B1 | * | 11/2001 | Kawabe ...................... 361/687 |
| 6,439,731 | B1 | * | 8/2002 | Johnson et al. ............... 362/29 |
| 6,515,857 | B2 | * | 2/2003 | Ford et al. ................... 361/687 |
| 6,522,543 | B2 | * | 2/2003 | Kurihara et al. ............ 361/704 |
| 6,552,899 | B2 | * | 4/2003 | Ronzani et al. ............. 361/687 |
| 6,737,790 | B2 | * | 5/2004 | Seki ............................ 313/47 |
| 2002/0167794 | A1 | * | 11/2002 | Ronzani et al. ............. 361/687 |
| 2003/0063462 | A1 | * | 4/2003 | Shimizu et al. ............. 362/230 |
| 2003/0136545 | A1 | * | 7/2003 | Lin et al. .................... 165/80.3 |
| 2003/0189829 | A1 | * | 10/2003 | Shimizu et al. ............. 362/240 |
| 2004/0001310 | A1 | * | 1/2004 | Chu et al. .................... 361/687 |
| 2004/0070934 | A1 | * | 4/2004 | Tomioka et al. ............ 361/687 |
| 2005/0073639 | A1 | * | 4/2005 | Pan ............................. 349/161 |

FOREIGN PATENT DOCUMENTS

| | | | |
|---|---|---|---|
| JP | U-63-72894 | | 5/1988 |
| JP | 08160410 | A * | 6/1996 |
| JP | A-11-242442 | | 9/1999 |
| JP | A-11-283752 | | 10/1999 |
| JP | A-2000-89682 | | 3/2000 |
| JP | A-2000-112370 | | 4/2000 |
| JP | A-2001-265237 | | 9/2001 |
| JP | A-2002-123178 | | 4/2002 |
| JP | A-2002-216948 | | 8/2002 |
| JP | 2002-343559 | A | 11/2002 |
| JP | 2003258474 | A * | 9/2003 |
| JP | 2004006096 | A * | 1/2004 |
| KR | A 2001-0088741 | | 9/2001 |
| KR | A 2003-0010285 | | 2/2003 |

* cited by examiner

*Primary Examiner*—Anatoly Vortman
(74) *Attorney, Agent, or Firm*—Oliff & Berridge, PLC

(57) ABSTRACT

To provide a display device with high reliability, which is capable of supporting a display panel well even when the display panel is enlarged, and capable of radiating the heat generated in the display panel well. A display device 100 of the present invention has an organic EL panel (display panel) 150 and a reinforcing structure 160 provided on the backside of the display panel 150. The reinforcing structure 160 comprises a base plate 161 forming a part adhered to a back face of the organic EL panel 150, and a heat radiation member 170 provided on the base plate 161.

15 Claims, 8 Drawing Sheets

REINFORCING STRUCTURE, DISPLAY DEVICE, AND ELECTRONIC APPARATUS

BACKGROUND OF THE INVENTION

1. Field of Invention

The present invention relates to a reinforcing structure, a display device, and an electronic apparatus.

2. Description of Related Art

An organic EL display device in which pixels are constituted with organic electroluminescent (EL) elements has been commercialized as a significantly thin flat panel display device which does not requires a backlight. When such an organic EL display device is supposed to be used for a television or a video monitor, the screen size of the television or video monitor is estimated to be about 50 inches (the diagonal length is about 127 cm) over 20 inches (the diagonal length is about 51 cm). On the other hand, when an organic EL display device of, for example, 50 inches having a panel thickness of about 2 mm is manufactured, a panel cannot be kept flat by itself. If any measure is not taken against the problem, therefore, curvature or deformation of the panel, or in some cases fracture thereof may be caused.

Thus, for example, Patent Document 1 discloses a flat panel display device comprising a reinforcing structure capable of coping with enlarging the screen size.

[Patent Document 1] Japanese Unexamined Patent Application Publication No. 2002-216948

SUMMARY OF THE INVENTION

Meanwhile, the organic EL elements are elements that emit light by current. The temperature of the display device rises due to Joule heat generated in wiring lines, etc. Since the rise in temperature becomes remarkable, in particular, in a panel having large screen size, it is necessary to positively radiate heat. However, the heat generated in the panel is not taken into consideration in the previous Patent Document 1.

The present invention has been achieved in consideration of the above problems of the related art. It is therefore an object of the present invention to provide a display device with high reliability, which is capable of supporting a display panel well even when the display panel is enlarged, and capable of radiating the heat generated in the display panel well. It is another object of the present invention to provide a reinforcing structure suitable for use with a large-sized display panel.

In order to achieve the above-mentioned objects, the present invention provides a display device having a display panel and a reinforcing structure provided on the backside of the display panel. The reinforcing structure comprises a supporting substrate forming a part adhered to a back face of the display panel, and a heat radiation member provided on the supporting substrate.

According to the above display device, since the display device comprises a reinforcing structure on the backside of a display panel, a display panel constructed by using a thin substrate (for example, a glass substrate having a thickness of about 2 mm) can be supported well, and a panel having large screen size as in a video display device, etc. can also be vertically supported well. Also, since the heat radiation member can radiate the heat generated in a display panel, the deterioration of reliability caused by overheat can be effectively prevented even when the display device is used as a display device having large screen size and having large heat output.

In the display device of the present invention, preferably, the heat radiation member is composed of a plurality of beam members arranged on the supporting substrate to intersect each other. According to this construction, since the plurality of beam members are arranged to intersect each other, an excellent deformation resistance in the planar direction of the supporting substrate can be exhibited, and an excellent supporting structure for the display panel can be realized. The above construction contributes to enlargement of the surface area of the heat radiation member, which makes it possible to provide excellent heat radiation characteristics.

In the display device of the present invention, the plurality of beam members can be arranged on the supporting substrate such that they are formed substantially in parallel crosses in plan view.

Further, in the display device of the present invention, the plurality of beam members can be arranged on the supporting substrate such that they are formed in a substantially triangular shape or substantially honeycomb shape in plan view.

According to these constructions, it is possible to provide a display device comprising a reinforcing structure having a heat radiation member with excellent supporting strength for a display panel with a simple construction.

In the display device of the present invention, the beam members can be provided with a heat radiation hole formed by cutting out parts thereof. According to this construction, warm air in the vicinity of the heat radiation member can be exhausted outward through the heat radiation holes. As a result, the cooling efficiency of the heat radiation member can be enhanced.

In the display device of the present invention, preferably, the heat radiation hole is formed by cutting out the end of the beam member opposite to the supporting substrate. According to this construction, the heat radiation holes can be easily formed at low cost, and the manufacturing cost of the heat radiation member and the reinforcing structure can be decreased.

In the display device of the present invention, preferably, the plurality of beam members constituting the heat radiation member are provided with a heat radiation hole passing through lateral faces of the beam members. According to such a construction, warm air in spaces surrounded by the beam members can be exhausted through the heat radiation holes. As a result, it is possible to provide a display device with high reliability, comprising a heat radiation member having excellent heat radiation characteristics.

In the display device of the present invention, preferably, a plurality of the heat radiation holes are provided to permit communication between a plurality of regions on the supporting substrate defined by the plurality of beam members. According to this construction, even when the backside (the side opposite to the display panel) of the heat radiation member is closed by a chassis of an electronic apparatus, etc., warm air in regions surrounded by the beam members can be exhausted to the outside of the heat radiation member through the heat radiation holes. As a result, excellent heat radiation characteristics can be obtained.

In the display device of the present invention, a plurality of the heat radiation holes can be provided to permit communication, in the vertical direction of the panel, between a plurality of regions on the supporting substrate defined by the plurality of beam members. According to this construction, warm air in regions surrounded by the beam members can be efficiently exhausted to the outside. In other words, the air warmed by heat generated in a display panel ascends in atmosphere. Thus, if heat radiation holes are continuously provided in the vertical direction of the display panel, the warm air ascends through the heat radiation holes. Therefore, warm air in spaces surrounded by the beam members can be efficiently exhausted without providing extra airflow forming means.

In the display device of the present invention, a plurality of the heat radiation holes may be provided to permit communication, in the horizontal direction of the panel, between a plurality of regions on the supporting substrate defined by the plurality of beam members. According to this construction, the warm air can also be exhausted through the heat radiation holes.

In the display device of the present invention, preferably, the plurality of the heat radiation holes that permit communication between the regions defined by the plurality of beam members is provided substantially at coaxial positions in side view in the direction in which the heat radiation holes are continuously provided. In this way, the plurality of the heat radiation holes is formed to overlap each other in side view so that warm air can be more effectively exhausted through the heat radiation holes. As a result, heat radiation characteristics by the heat radiation member can be improved.

In the display device of the present invention, heat radiation fins can be provided on the supporting substrate. According to this construction, the heat generated in a display panel can be more positively diffused by the heat radiation fins. Moreover, when the heat radiation fins and the beam members are arranged such that both are engaged with each other, the heat radiation fins concerned can also increase the strength of a reinforcing structure.

In the display device of the present invention, preferably, the heat radiation fins extend substantially parallel to the direction in which the plurality of heat radiation holes are continuously provided, which permits communication between the regions on the supporting substrate defined by the plurality of beam members. In other words, when beam members are formed with heat radiation holes, air in spaces surrounded by the beam members is exhausted through the heat radiation holes concerned. Thus, it is preferable that the heat radiation fins extend in the direction of traveling of warm air to be exhausted so that turbulence due to the heat radiation fins does not occur in airflow.

In the display device of the present invention, the plurality of beam members may be more densely arranged on the supporting substrate corresponding to a peripheral portion of the display panel. According to such a construction, the panel support strength by means of the reinforcing structure can be enhanced without increasing the number of the beam members.

In the display device of the present invention, the plurality of beam members can be more densely arranged on the supporting substrate corresponding to a central part of the display panel. According to such a construction, heat radiation of a central part of a panel where heat output becomes relatively large can be efficiently performed without increasing the number of beam members.

In the display device of the present invention, preferably, the heat radiation member is made of metal. Since the display device comprises the heat radiation member made of metal, it is possible to provide a reinforcing structure, which is excellent in both the supporting strength and heat radiation characteristics of a display panel.

In the display device of the present invention, the supporting substrate can also serve as a substrate constituting the display panel. According to this construction, the number of parts and the number of manufacturing processes of a display device can be reduced, and the manufacturing efficiency can be improved, and the manufacturing cost can be reduced. Further, since display elements, driving circuits, etc. that are principal heat radiating spots of a display panel, get closer to the heat radiation member, the heat radiation can be more positively performed. Moreover, sharing the supporting substrate contributes to making a display device thinner.

In the display device of the present invention, the display panel can be a display panel comprising organic electroluminescent elements. According to this construction, it is possible to provide an organic EL display device, which is excellent in the supporting strength and the heat radiation characteristics of a panel.

In the display device of the present invention, the supporting substrate can also serve as a sealing structure for the organic electroluminescent elements. According to this construction, it is possible to provide a thin organic EL display device at low cost, which is excellent in the supporting strength and the heat radiation characteristics.

Next, in order to achieve the above-mentioned objects, the present invention provides a reinforcing structure capable of being applied to a display panel having display elements on a substrate. The reinforcing structure comprises a supporting substrate forming a part adhered to the display panel, and a heat radiation member provided on the supporting substrate. Since the reinforcing structure having the construction concerned is arranged on the backside of a thin display panel such as a liquid crystal panel or an organic EL display panel, it functions as supporting and cooling means of the display panel, which contributes to realizing a display apparatus having excellent strength and reliability.

In the display device of the present invention, preferably, the display device further comprises a chassis accommodating the display panel and the heat radiation member. The chassis includes air supply means and air exhaust means arranged in close proximity to the heat radiation member. Preferably, the air supply means and the air exhaust means are arranged in the direction in which the heat radiation holes are continuously provided.

According to this construction, the display device comprises a chassis where airflow passing through the heat radiation holes can be formed by means of the air supply means and the air exhaust means. Thereby, since excellent cooling efficiency can be obtained, it is possible to provide a display device with high reliability.

Further, in the above construction, preferably, the air supply means and the air exhaust means are fans and through-holes, which are arranged at the chassis. According to this construction, airflow in a predetermined direction can be extremely easily formed within the chassis. As a result, it is possible to provide a chassis and a display device, which can be manufactured at low cost.

Next, an electronic apparatus of the present invention comprises the display device of the present invention described above. According to this construction, it is possible to provide an electronic apparatus comprising a display unit with high reliability, which supports a display panel having a large screen well and provide excellent heat radiation characteristics.

DETAILED DESCRIPTION OF PREFERRED EMBODIMENTS

Hereinafter, preferred embodiments of the present invention will be described with reference to the accompanying drawings.

(First Embodiment)

Figure 1:
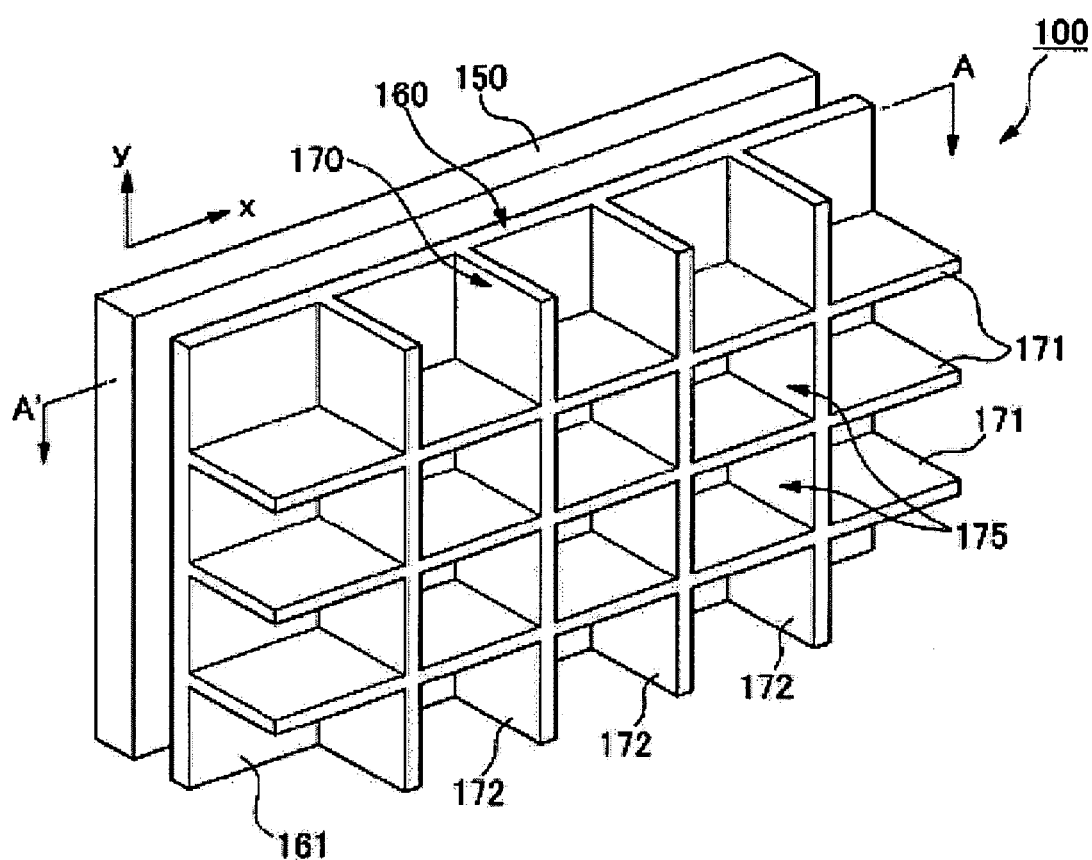
FIG. 1 is a perspective view illustrating the construction of an organic EL display device of a first embodiment.
Figure 2:
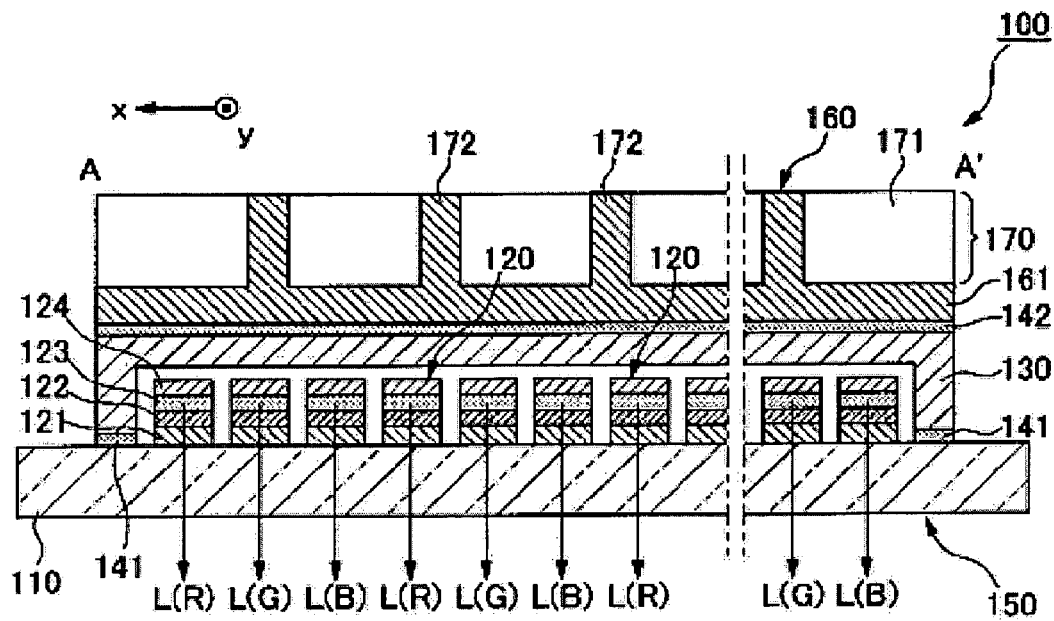
FIG. 2 is a sectional view illustrating the construction of the organic EL display device of the first embodiment.

FIG. 1 is a perspective view illustrating the construction of an organic EL display device that is one embodiment of a display device according to the present invention, and FIG. 2 is a sectional constructional view taken along a line A-A' in FIG. 1. An organic EL display device 100 shown in FIGS. 1 and 2 mainly comprises an organic electroluminescent panel (an organic EL panel) 150 that is a display panel, and a reinforcing structure 160 arranged on the backside (the side nearer to an observer in the drawing) of the panel.

The organic EL panel 150 is mainly composed of a substrate 110 having a light-transmitting property, a plurality of organic EL elements (light-emitting elements) 120 formed on the substrate 110, and a sealing member 130 applied to cover the organic EL elements 120 and hermetically adhered to the substrate 110 with a sealant 141 interposed therebetween. The organic EL panel 150 according to the present embodiment is of a so-called bottom emission type that radiates emitting light from the substrate 110 side.

The reinforcing structure 160 is composed of a metallic base plate (a supporting substrate) 161 adhered to a back face of the organic EL panel 150 and a metallic heat radiation member 170 which is integrally formed with an external surface (a top surface in FIG. 2) of the base plate 161. The heat radiation member 170 has a construction in which a plurality of (three in the drawing) first beam members 171 extending in the direction of "x" in the drawing and a plurality of (four in the drawing) second beam members 172 extending in the direction of "y" in the drawing are integrally formed in parallel crosses in plan view. The first beam members 171 and the second beam members 172 are substantially rectangular plate-like members, and are erected substantially vertically with respect to the surface of the base plate 161.

Also, as shown in FIG. 2, the reinforce structure 160 is adhered the sealing member 130 of the organic EL panel 150 with an adhesive layer 142 interposed therebetween and adapted to support the organic EL panel 150. A heat-conductive sheet whose both sides are coated with an adhesive material can be used as the adhesive layer 142.

After the base plate 161 and the sealing member 130 are adhered to each other, for example, the peripheral portion of the base plate 161 is caulked so that a part adhering the base plate and the sealing member to each other can be reinforced.

In the present embodiment, the organic EL panel 150 has a screen size of 30 inches (about 752 mm) in its diagonal direction, and has outside dimension of about 610 mm (x direction)×about 460 mm (y direction). The base plate 161 has planar dimension of 670 mm (x direction)×520 mm (y direction). The beam members 171 and 172 that constitute the heat radiation member 170 are 15 mm in height and 2 mm in thickness. The distance between the adjacent beam members 171 and the distance between the adjacent beam members 172 are all 30 mm. Accordingly, FIG. 1 illustrates only the three first beam members 171 and the four second beam members 172. However, seventeen first beam members 171 and twenty-one second beam members 172 are provided in actuality.

In the organic EL display device 100 of the present embodiment having the above construction, the reinforcing structure 160 that supports the organic EL panel 150 has the heat radiation member 170 composed of the first beam members 171 and second beam members 172, which are assembled in parallel crosses in plan view. Thus, deformation hardly occurs in the x direction and in the y direction, which makes it possible to realize an excellent panel supporting structure. As a result, even if the screen size of the organic EL panel 150 is made large to about 50 inches, it is possible to provide an organic EL display device having excellent durability and reliability without causing curvature or deformation in the organic EL panel 150. Further, in the present embodiment, since the heat radiation member 170 composed of the beam members 171 and 172 assembled in parallel crosses are provided, the heat generated in the organic EL panel 150 can be effectively diffused, and the organic EL elements 120, driving control circuits (not shown), etc. can be effectively prevented from malfunctioning caused by the overheat of the panel.

As described above, the display device comprises the reinforcing structure 160 according to the present embodiment, so that the organic EL panel 150 using the thin substrate 110 can be supported well and the heat generated in the organic EL panel 150 can be diffused with high efficiency. Thus, it is possible to provide the organic EL display device 100 at low cost, which is excellent in structural durability and reliability and capable of easily coping with enlarging the screen size.

In addition, in the present embodiment, the base plate 161 of the reinforcing structure 160 is integrally formed with the heat radiation member 170. However, it is a matter of course that the base plate 161 and the heat radiation member 170 may be separately prepared and bonded to each other to make the reinforcing structure 160. The base plate 161 and the heat radiation member 170 according to the present embodiment are all made of metal, for example, aluminum or copper, as their constituent materials. However, in order to prevent the EL panel 150 and the reinforcing structure 160 from being peeled off from each other due to difference between their coefficients of thermal expansion when heat is applied, it is preferable that a metallic material or alloy material having a small coefficient of thermal expansion be used to make the base plate 161 and the heat radiation member 170. The base plate 161 and heat radiation member 170 can be made of various materials, not limited to metal, as long as good thermal conductivity (heat radiation characteristics) and sufficient panel supporting strength can be obtained.

Further, in the present embodiment, the beam members 171 and 172 of the heat radiation member 170 are arranged at regular intervals and at right angles with each other. However, the beam members 171 and 172 can be unevenly distributed on the base plate 161. For example, if the beam members 171 and 172 are relatively densely arranged on the peripheral portion of the surface of the base plate 161 and sparsely arranged in the same center thereof, the reinforcing structure 160 having favorable supporting strength can be obtained without providing a large number of beam members. Further, when the heat exhaust characteristics of the heat radiation member 170 are considered very important, the beam members 171 and 172 may be densely arranged in the center of the panel where heat output becomes relatively larger.

Further, in the present embodiment, the beam members 171 and 172 are arranged such that regions 175, on the base plate 161, defined by the beam members 171 and 172, have a rectangular shape in plan view. However, for example, a plurality of beam members may be arranged on the base plate 161 such that the planar shape of the regions 175 becomes, for example, a triangular shape, a honeycomb shape (i.e., a hexagonal shape), or same other polygonal shape. Even if the regions 175 have any shape, the heat radiation member 170 is constructed with beam members extending to intersect each other on the base plate 161. Thus, deformation hardly occurs in the x direction and in the y direction in the drawing. As a result, the organic EL panel 150 with a larger screen can also be supported well.

Hereinafter, the construction of the organic EL panel 150 will be described in detail.

As shown in FIG. 2, each of the organic EL elements 120 arranged on the substrate 110 has a construction in which an anode 121, a hole injection layer 122, a light-emitting layer 123, and a cathode 124 are sequentially laminated from the substrate 110. The light-emitting layers 123 of the organic EL elements 120 arranged on the substrate 110 are composed of light-emitting layers with three colors of red (R), green (G) and blue (B). Also, the organic EL elements 120 (sometimes, referred to as "dots") with three colors of red, green and blue constitute one pixel of the organic EL display device 100.

Switching elements such as thin film transistors (TFTs) (not shown) are provided to correspond to the respective organic EL elements 120. The switching elements drive the respective dots (the organic EL elements 120) using an active matrix drive method.

In addition, in FIG. 2, the organic EL elements 120 are arranged such that they are separated from each other in a plane. However, partition walls may be provided between the organic EL elements 120 for partitioning the organic EL elements 120 from each other. Further, the organic EL elements 120 that constitute each pixel may be driven using a simple matrix drive method.

The substrate 110 includes a light-transmitting substrate made of transparent glass, quartz, or etc. to allow emitting light to be transmitted and emitted therethrough.

As will be described below, the anode 121 is also formed of a transparent conductive material for allowing light emitted from the light-emitting layer 123 to be transmitted therethrough. Preferably, indium tin oxide (ITO) can be used as the transparent conductive material. Further, the surface of the ITO (the anode 121) is subjected to $O_2$ plasma treatment, if necessary. Thereby, the cleaning of the electrode surface and the adjustment of work functions are carried out, and a lyophilic property is given to the electrode surface.

The hole injection layer 122 formed on the anode 121 is formed, for example, by adding polystyrene sulfonic acid to a polythiophene derivative. In other words, specifically, polyethylenedioxythiophene/polystyrene sulfonic acid, etc. is preferably used as a material for forming the hole injection layer 122.

In addition, various materials other than the aforementioned ones can be used as the forming material for the hole injection layer 122. For example, materials obtained by dispersing polystyrene, polypyrrole, polyaniline, polyacetylene or derivatives thereof in an appropriate dispersion medium along with the polystyrene sulfonic acid can be used as the forming material of the hole injection layer 122.

The light-emitting layer 123 is formed of a known polymer light-emitting material capable of emitting fluorescence or phosphorescence.

When the polymer material is used as the light-emitting material, the polymer material is made into a solution by using a solvent which does not remelt the hole injection layer 122, and a film is formed by a spin coating method or a droplet ejection method, such as an ink jet method.

Further, a light-emitting material comprising a low molecular material may be used as the forming material of the light-emitting layer 123. Here, when the light-emitting layer 123 is formed of the low molecular material, a hole-transporting layer, a light-emitting layer and an electron-transporting layer, which are all made of the low molecular material, are laminated in this order from the anode 121 side, thereby forming the organic EL element 120.

The cathode 124 can be composed of a metal electrode made of calcium, magnesium, etc.

In this way, the sealing member 130 for covering the organic EL elements 120 composed of these respective layers is provided on the respective layers laminated on the substrate 110. The sealing member 130 is adhered to the substrate 110 with the sealant 141 interposed therebetween. For example, a plate-shaped sealing substrate having, for example, an electric insulating property is used as the sealing member 130. When the sealing substrate is used as the sealing member 130, the sealing substrate is fixed to the substrate 110 with a sealing resin while covering the organic EL elements 120. For example, a thermosetting resin or an ultraviolet cure resin is used as the sealing resin. Further, the organic EL elements may be covered and sealed only with the sealing resin without using the sealing substrate.

(Second Embodiment)

Next, a second embodiment of the present invention will be described with reference to FIG. 3.

Figure 3:
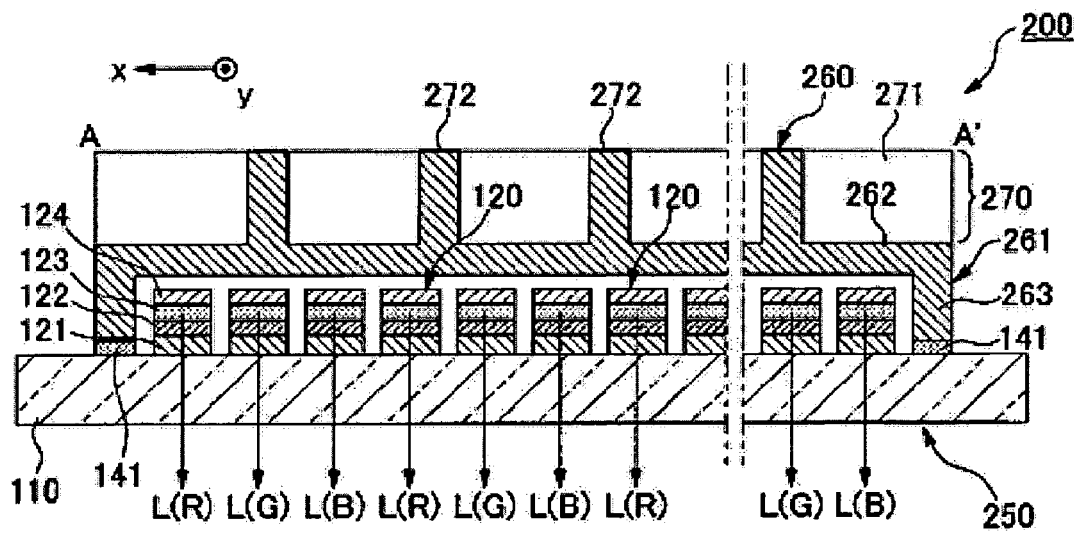
FIG. 3 is a sectional view illustrating the construction of an organic EL display device of a second embodiment.

FIG. 3 is a sectional view illustrating the construction of an organic EL display device (a display device) 200 of the present embodiment. The appearance of the organic EL display device 200 of the present embodiment is almost the same as that of the organic EL display device 100 shown in FIG. 1, and the sectional structure shown in FIG. 3 almost corresponds to a section taken along the line A-A' in FIG. 1. In addition, elements in FIG. 3 similar to those in FIGS. 1 and 2 are given reference numerals similar to those in FIGS. 1 and 2, and the description thereof will be omitted.

The organic EL display device 200 mainly comprises an organic EL panel 250 and a reinforcing structure 260. The organic EL panel 250 is composed of a plurality of organic EL elements 120 which are arranged in a matrix in plan view on a substrate 110.

On the other hand, the reinforcing structure 260 is composed of a metallic base plate (a supporting substrate) 261 adhered to cover the organic EL elements 120 of the organic EL panel 250 and a metallic heat radiation member 270 which is integrally formed with an external surface (a top surface in FIG. 3) of the base plate 261.

In the present embodiment, the base plate 261 is formed in the shape of a box that can be deposited on regions where the organic EL elements 120 are formed. Specifically, the base plate 261 is composed of a flat plate part 262, and a sidewall part 263 having a frame shape in plan view and formed to rise up from the peripheral end thereof. Also, the base plate 261 adhered to cover the organic EL elements 120 of the organic EL panel 250 is hermetically adhered to the substrate 110 by adhering the tip face (the lower end face in FIG. 3) of the sidewall part 263 to the substrate 110 with a sealant 141 interposed therebetween. In addition, the inner surface of the base plate 261 (the lateral surface of the organic EL panel 250) can be provided with an insulating film for preventing circuits, wiring lines of the organic EL elements 120, etc. from short-circuiting.

The heat radiation member 270 has almost the same construction as that of the heat radiation member 170 shown in FIG. 1. In other words, the heat radiation member 270 has a construction in which a plurality of first beam members 271 extending in the direction of "x" in the drawing and a plurality of (four in FIG. 3) second beam members 272 extending in the direction of "y" in the drawing are integrally formed in parallel crosses in plan view. Both the first beam members 271 and the second beam members 272 are substantially rectangular plate-like members, and are erected substantially vertically with respect to the top face of the base plate 261.

In the organic EL display device 200 of the present embodiment having the above construction, the base plate 261 of the reinforcing structure 260 also serves as a sealing member for the organic EL panel 250. Thus, as compared to the organic EL display device 100, the number of parts can be decreased, the manufacturing process can be simplified, and the manufacturing cost can be reduced. Further, it is possible to make an organic EL display device thin while securing the supporting strength equal to that of the organic EL display device 100.

(Third Embodiment)

Next, a third embodiment of the present invention will be described with reference to FIG. 4.

Figure 4:
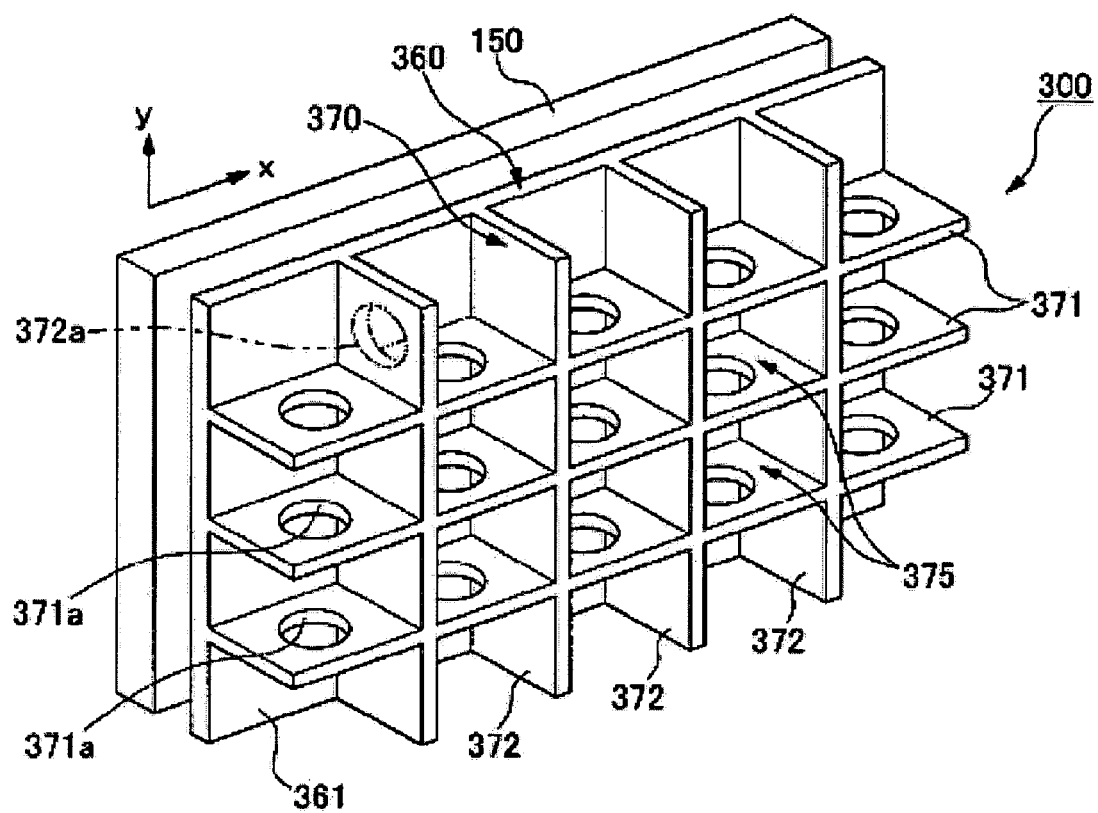
FIG. 4 is a perspective view illustrating the construction of an organic EL display device of a third embodiment.

FIG. 4 is a perspective view illustrating the construction of an organic EL display device (a display device) 300 of the present embodiment. The organic EL display device 300 mainly comprises an organic EL panel 150 and a reinforcing structure 360 arranged on the backside of the panel. The organic EL panel 150 has the same construction as that of the organic EL panel according to the first embodiment. The description thereof will be omitted below.

The reinforcing structure 360 mainly comprises a metallic base plate (a supporting substrate) 361 adhered to a back face of the organic EL panel 150 and a metallic heat radiation member 370 which is integrally formed with an external surface (a surface nearer to an observer in FIG. 4) of the base plate 361. The heat radiation member 370 has a construction in which a plurality of (three in FIG. 4) first beam members 371 extending in the direction of "x" in the drawing and a plurality of (four in FIG. 4) second beam members 372 extending in the direction of "y" in the drawing are integrally formed in parallel crosses in plan view. The first beam members 371 and the second beam members 372 are substantially rectangular plate-like members, and are erected substantially vertically with respect to the outer surface of the base plate 361. In the present embodiment, heat radiation holes 371a are provided to pass through the beam members 371 extending in the direction of "x" and to communicate with regions 375, in the direction of "y" in the drawing, which are defined by the beam members 371 and 372. In other words, circular heat radiation holes 371a are provided to pass through the beam members 371 arranged above or below each region 375 having a rectangular shape in plan view.

Similar to the organic EL display device of the first embodiment, the reinforcing structure 360 according to the present embodiment having the above construction, as shown in FIG. 2, is adhered to the sealing member 130 of the organic EL panel 150 with the adhesive layer 142 interposed therebetween so as to support the organic EL panel 150.

In the organic EL display device 300 according to the present embodiment having the above construction, the heat radiation holes 371a are continuously provided in the direction of "y" in FIG. 4 to pass through the first beam members 371 of the reinforcing structure 360, so that the heat generated in the organic EL panel 150 can be more effectively diffused. In FIG. 4, the heat radiation member 370 is opened at the backside thereof. However, when the display device is actually mounted on a display unit of an electronic apparatus, etc., the heat radiation member 370 is closed with a chassis in proximity to or in a state abutting on the chassis. Therefore, the airflow in the regions 375 defined by the beam members comes to nearly stop. Accordingly, as in the present embodiment, the heat radiation holes 371a are provided in the beam members 371 defining the regions 375 to allow communication between the regions 375, so that the regions 375 adjacent to each other in the direction of "y" in the drawing can be communicated with each other to exhaust the air heated by the heat generated in the organic EL panel 150 to the outside of the heat radiation member 370. Further, since the air warmed by the heat generated in the panel rises upward in the direction of "y" in the drawing, as shown in FIG. 4, the heat radiation holes 371a are continuously provided in the direction of "y" in the drawing so that the exhaust efficiency of the warm air can be more enhanced.

Meanwhile, it can be supposed that the organic EL display device 300 is also used in its longitudinal posture, not limited to being used in its transverse posture (posture in which the display surface of the display device is used while being transversely long arranged) shown in FIG. 4. Even in that case, in order to efficiently perform the exhaust of air using the rising of warm air, a plurality of heat radiation holes 372a may be continuously provided in the direction of "x" in the drawing in the second beam members 372 extending in the direction of "y" in the drawing for allowing communication between the regions 375 arranged in the direction of "x" in the drawing.

Further, although the present embodiment has described the case in which the heat radiation holes 371a and 372a are formed in a round shape, the shape or size of the heat radiation holes 371a and 372b can be appropriately modified. For example, elliptical or rectangular heat radiation holes may be provided, and the diameter of the heat radiation holes can be varied depending on positions at which the heat radiation holes are provided.

As described above, the plurality of the heat radiation holes 371a and 372a are provided in a range that does not decrease the strength of the reinforcing structure 360 so that the airflow in the heat radiation member 370 can be secured and the cooling efficiency can be enhanced. Also, the display device comprises the reinforcing structure 360 according to the present embodiment so that the organic EL panel 150 using the thin substrate 110 can be supported well, and the heat generated in the organic EL panel 150 can be diffused with high efficiency. Thus, it is possible to provide the organic EL display device 300 at low cost, which is excellent in structural durability and reliability and is capable of easily coping with enlarging the screen size.

Figure 5:
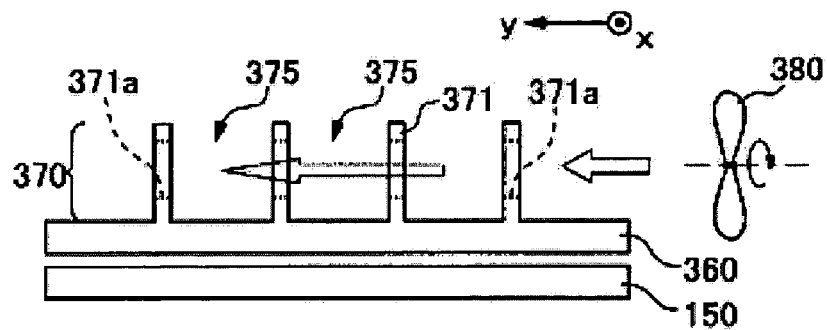
FIG. 5 is a side constructional view for explaining a cooling operation of the organic EL display device of the third embodiment.

Further the provision of the heat radiation holes 371a contributes to making the organic EL display device 300 or an electronic apparatus comprising the same thin. FIG. 5 is a side view illustrating a construction in which a cooling fan (cooling means) 380 is provided at the side of the organic EL display device 300. As shown in FIG. 5, when the organic EL display device 300 of the present embodiment is cooled by the cooling fan 380, cooling air from the cooling fan can be spread into the regions 375 via the heat radiation holes 371a from the lateral side of the heat radiation member 370. Thus, the organic EL display device 300 can be made thin as compared to an organic EL display device having a cooling fan arranged on the backside thereof.

(Fourth Embodiment)

Next, a fourth embodiment of the present invention will be described with reference to FIG. 6.

Figure 6:
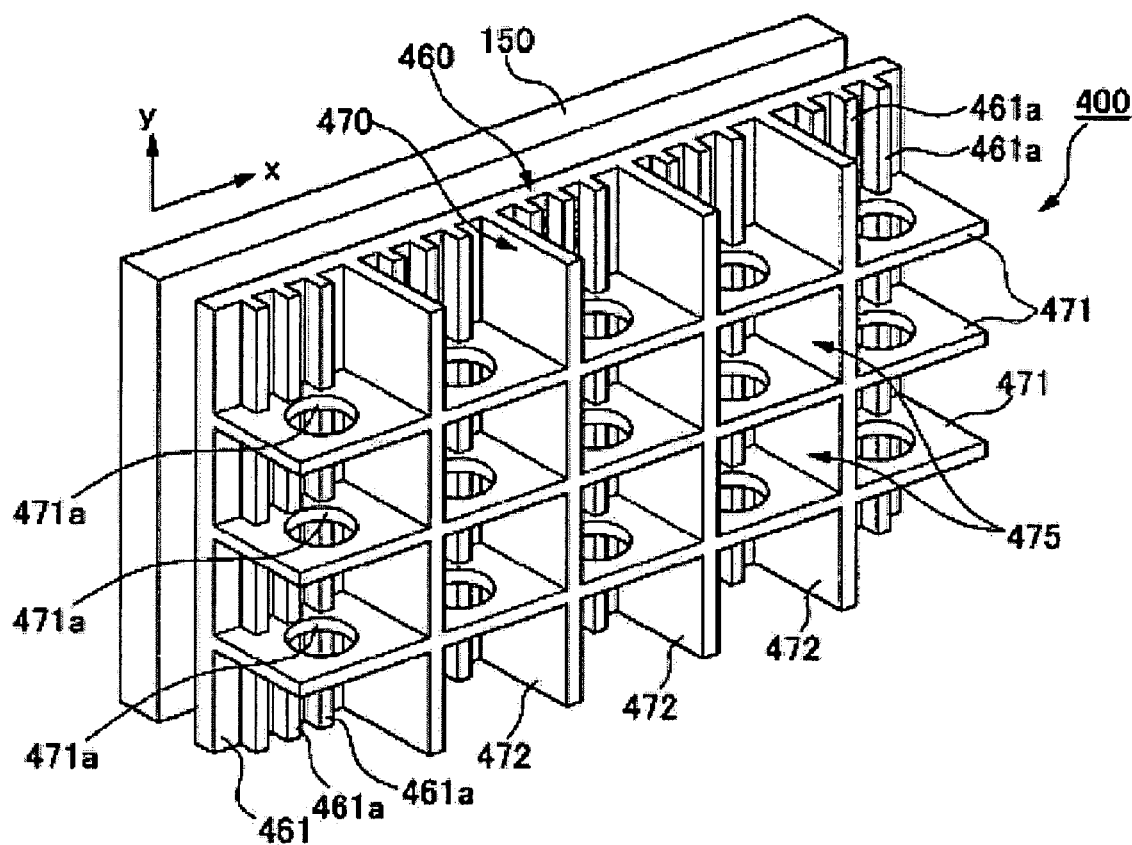
FIG. 6 is a perspective view illustrating the construction of an organic EL display device of a fourth embodiment.

FIG. 6 is a perspective view illustrating the construction of an organic EL display device 400 of the present embodiment. The organic EL display device 400 mainly comprises an organic EL panel 150 and a reinforcing structure 460 arranged on the backside of the panel. The organic EL panel 150 has the same construction as that of the organic EL panel according to the first embodiment. Therefore, the description thereof will be omitted below.

The reinforcing structure 460 is composed of a metallic tabular base plate (a supporting substrate) 461 adhered to a back face of the organic EL panel 150 and a metallic heat radiation member 470 which is integrally formed with an external surface (a surface nearer to an observer in FIG. 6) of the base plate 461. The heat radiation member 470 has a construction in which a plurality of (three in FIG. 6) first beam members 471 extending in the direction of "x" in the drawing and a plurality of (four in FIG. 6) second beam members 472 extending in the direction of "y" in the drawing are integrally formed in parallel crosses in plan view. The first beam members 471 and the second beam members 472 are substantially rectangular plate-like members, and are erected substantially vertically with respect to the outer surface of the base plate 461. Further, heat radiation holes 471a are provided to pass through the beam members 471 extending in the direction of "x" in the drawing and to communicate with regions 475, in the direction of "y" in the drawing, which are defined by the beam members 471 and 472. In other words, circular heat radiation holes 471a are provided to pass through the beam members 471 arranged above or below each region 375 having a rectangular shape in plan view.

Also, in the heat radiation member 470 according to the present embodiment, a plurality of heat radiation fins 461a are provided on the external surface (the surface nearer to an observer in FIG. 6) of the base plate 461 so as to extend in the direction of "y" in the drawing. The heat radiation fins 461a are constructed such that, for example, rectangular plates having a height of about 5 mm and a thickness of about 3 mm are erected substantially vertically with respect to the base plate 461 and substantially parallel to each other.

In the organic EL display device 400 of the present embodiment, the heat radiation fins 461a are provided on the base plate 461 so that the heat radiation of the organic EL panel 150 can be more positively performed.

Further, the heat radiation fins 461a are formed to extend in the direction (y direction) of continuously providing the heat radiation holes 471a to pass through the first beam members 471. According the this construction, heat exhaust can be effectively performed without obstructing exhaust of warm air in the heat radiation member 470 and an excellent heat radiation effect can be obtained.

In this way, the display device comprises the reinforcing structure 460 according to the present embodiment so that the organic EL panel 150 using the thin substrate 110 can be supported well and the heat generated in the organic EL panel 150 can be diffused with high efficiency. Thus, it is possible to provide the organic EL display device 400 at low cost, which is excellent in structural durability and reliability and is capable of easily coping with enlarging the screen size.

(Fifth Embodiment)

Next, a fifth embodiment of the present invention will be described with reference to FIG. 8.

Figure 8:
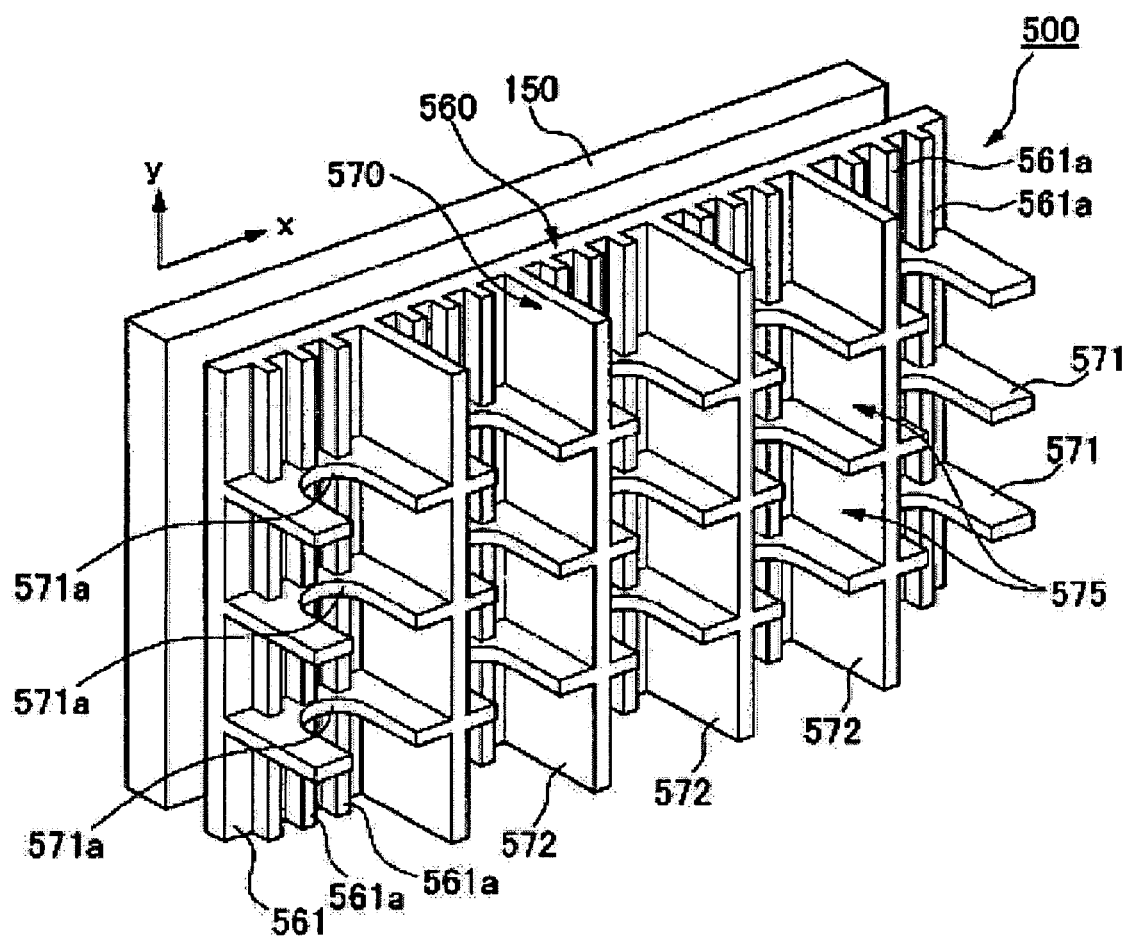
FIG. 8 is a perspective view illustrating the construction of an organic EL display device of a fifth embodiment.

FIG. 8 is a perspective view illustrating the construction of the organic EL display device 500 of the present embodiment. The organic EL display device 500 mainly comprises an organic EL panel 150 and a reinforcing structure 560 arranged on the backside of the panel. The organic EL panel 150 has the same construction as that of the organic EL panel according to the first embodiment. Therefore, the description thereof will be omitted below.

The reinforcing structure 560 mainly comprises a metallic tabular base plate (a supporting substrate) 561 adhered to a back face of the organic EL panel 150 and a metallic heat radiation member 570 which is integrally formed with an external surface (a surface nearer to an observer in FIG. 8) of the base plate 561. The heat radiation member 570 has a construction in which a plurality of (three in FIG. 8) first beam members 571 extending in the direction of "x" in the drawing and a plurality of (four in FIG. 8) second beam members 572 extending in the direction of "y" in the drawing are integrally formed in parallel crosses in plan view. The first beam members 571 and the second beam members 572 are substantially rectangular plate-like members, and are erected substantially vertically with respect to the outer surface of the base plate 561.

Further, the beam members 571 extending in the direction of "x" in the drawing are provided with a plurality of cutout portions (heat radiation holes) 571a formed by cutting out a surface of a plate from the outside (the backside of the panel) thereof. These cutout portions 571a allows regions 575 defined by the beam members 571 and 572 to communicate with each other substantially in the direction of "y" in the drawing. In other words, the cutout portions 571a are respectively provided in the beam members 571 that form upper and lower sidewalls of each region 575 having a rectangular shape in plan view. In the present embodiment, when the plurality of the heat radiation holes 571a are seen from the direction "y" in the drawing, they are formed in the same shape and at almost the same position.

A plurality of heat radiation fins 561a are provided on the external surface (the surface nearer to an observer in FIG. 8) of the base plate 561 so as to extend in the direction of "y" in the drawing. The heat radiation fins 561a are constructed such that, for example, rectangular plates having a height of about 5 mm and a thickness of about 3 mm are erected substantially vertically with respect to the base plate 561 and substantially parallel to each other.

In the organic EL display device 500 of the present embodiment, warm air can be exhausted through the cutout portions 571*a* continuously provided in the direction of "y" in the drawing, so that an excellent heat radiation effect can be obtained. Further, since the cutout portions 571*a* can be formed only by cutting out the first beam members 571 from the outside thereof, the heat radiation member 570 can be easily manufactured at low cost as compared to the heat radiation member 370 having the heat radiation holes 371*a* according to the third embodiment.

Further, even in the organic EL display device 500 of the present embodiment, since the heat radiation fins 561*a* are provided on the base plate 561, the heat radiation of the organic EL panel 150 can be positively performed. Moreover, since the heat radiation fins 561*a* are formed to extend in the direction (y direction) of continuously providing the cutout portions 571*a* formed in the first beam members 571, heat exhaust can be effectively performed without obstructing exhaust of warm air in the heat radiation member 570 and an excellent heat radiation effect can be obtained.

In this way, since the display device comprises the reinforcing structure 560 according to the present embodiment so that the organic EL panel 150 using the thin substrate 110 can be supported well and the heat generated in the organic EL panel 150 can be diffused with high efficiency, it is possible to provide the organic EL display device 500 at low cost, which is excellent in structural durability and reliability and is capable of easily coping with enlarging the screen size.

(Sixth Embodiment)

Next, a sixth embodiment of the present invention will be described with reference to FIG. 9.

Figure 9:
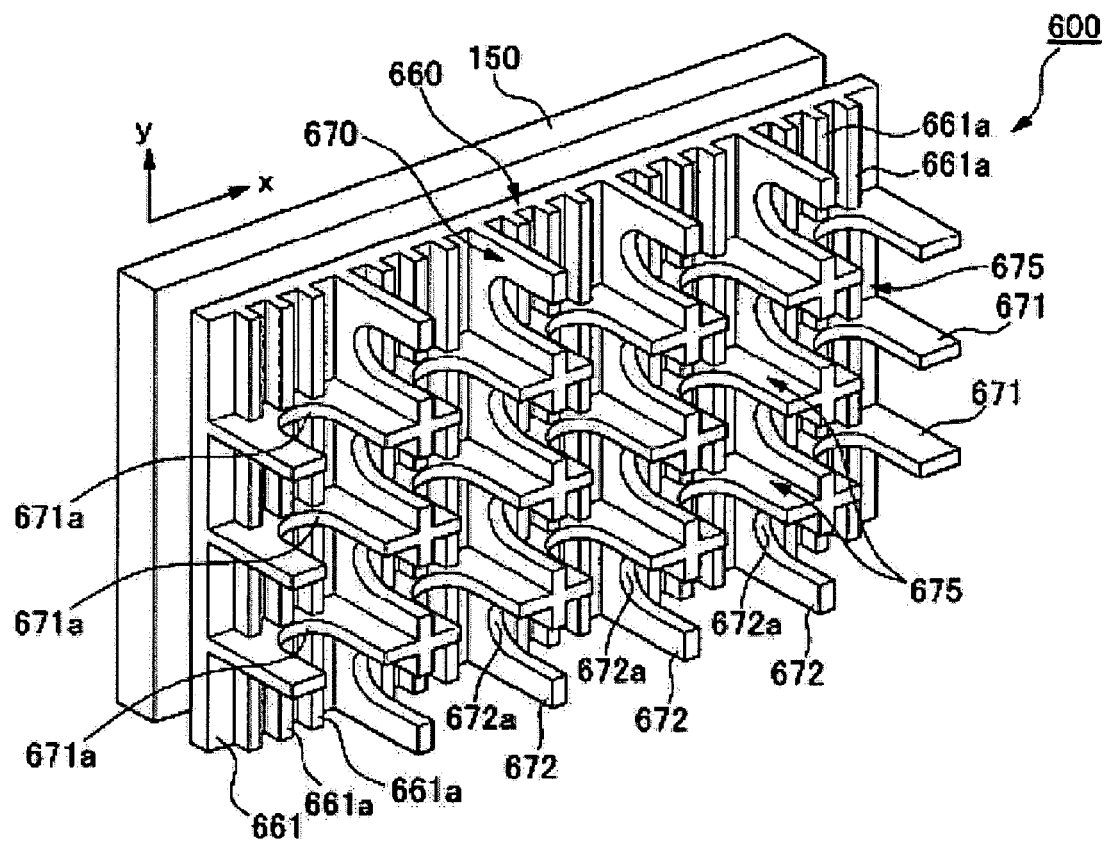
FIG. 9 is a perspective view illustrating the construction of an organic EL display device of a sixth embodiment.

FIG. 9 is a perspective view illustrating the construction of an organic EL display device 600 of the present embodiment. The organic EL display device 600 mainly comprises an organic EL panel 150 and a reinforcing structure 660 arranged on the backside of the panel. The organic EL panel 150 has the same construction as that of the organic EL panel according to the first embodiment. Therefore, the description thereof will be omitted below.

The reinforcing structure 660 mainly comprises a metallic tabular base plate (a supporting substrate) 661 adhered to a back face of the organic EL panel 150 and a metallic heat radiation member 670 which is integrally formed with an external surface (the surface nearer to an observer in FIG. 9) of the base plate 661. The heat radiation member 670 has a construction in which a plurality of (three in the drawing) first beam members 671 extending in the direction of "x" in the drawing and a plurality of (four in the drawing) second beam members 672 extending in the direction of "y" in the drawing are integrally formed in parallel crosses in plan view. The first beam members 671 and the second beam members 672 are substantially rectangular plate-like members, and are erected substantially vertically with respect to the outer surface of the base plate 661.

Further, a plurality of heat radiation fins 661*a* are provided on the external surface (the surface nearer to an observer in FIG. 9) of the base plate 661 so as to extend in the direction of "y" in the drawing. The heat radiation fins 661*a* are constructed such that, for example, a rectangular plate having a height of about 5 mm and a thickness of about 3 mm are erected substantially vertically with respect to the base plate 661 and substantially parallel to each other.

In the present embodiment, the first beam members 671 extending in the direction of "x" in the drawing are provided with a plurality of cutout portions (heat radiation holes) 671*a* formed by cutting out a surface of a plate from the outside (the backside of the panel) thereof. The second beam members 672 extending in the direction of "y" in the drawing are provided with a plurality of cutout portions 672*a* formed by cutting out a surface of a plate from the outside thereof. Also, these cutout portions 671*a* and 672*a* allows regions 675 defined by the beam members 671 and 672 to communicate with each other in the "x" direction and in the "y" direction. In other words, the cutout portions 671*a* and 672*a* are provided to surround the regions 675 having a rectangular shape in plan view.

In the organic EL display device 600 of the present embodiment, warm air can be efficiently exhausted through the cutout portions 671*a* and 672*a* continuously provided in the "x" direction and in the "y" direction in the drawing. Thus, even when the organic EL display device 600 is used in any of the longitudinal and transverse postures thereof, an excellent heat radiation effect can be obtained. Further, since the cutout portions 671*a* and 672*a* can be formed only by cutting out the beam members 671 and 672 from the outside thereof, the heat radiation member 670 can be easily manufactured at low cost as compared to the heat radiation member 370 having the heat radiation holes 371*a* and 372*a* according to the third embodiment.

Further, in the organic EL display device 600 of the present embodiment, since the heat radiation fins 661*a* are provided on the base plate 661, the heat radiation of the organic EL panel 150 can be positively performed. Moreover, since the heat radiation fins 661*a* are formed to extend in the direction (y direction) of continuously providing the cutout portions 671*a* formed in the first beam members 671, heat exhaust can be effectively performed without obstructing exhaust of warm air in the heat radiation member 670 and an excellent heat radiation effect can be obtained.

In this way, since the reinforcing structure 660 according to the present embodiment is provided so that the organic EL panel 150 using the thin substrate 110 can be supported well and the heat generated in the organic EL panel 150 can be diffused with high efficiency, it is possible to provide an organic EL display device at low cost, which is excellent in structural durability and reliability and is capable of easily coping with enlarging the screen size.

(Seventh Embodiment)

Next, a seventh embodiment of the present invention will be described with reference to FIG. 10. The present embodiment is built to have a chassis suitable for use with the organic EL display device according to the third to sixth embodiments.

In addition, the present embodiment illustrates an organic EL display device 700 having a construction in which the organic EL display device 600 is accommodated in a chassis 710. However, instead of the organic EL display device 600, it is a matter of course that the organic EL display device of the third to fifth embodiments may be accommodated in the chassis 710. Further, even when the organic EL display device of the first or second embodiment having no heat radiation holes or cutout portions is accommodated in the chassis 710, the chassis and the heat radiation member are arranged in a state separated from each other by a certain distance so that a flow path of warm air can be secured. Thus, an equivalent heat radiation effect can be obtained.

Figures 10A, 10B:
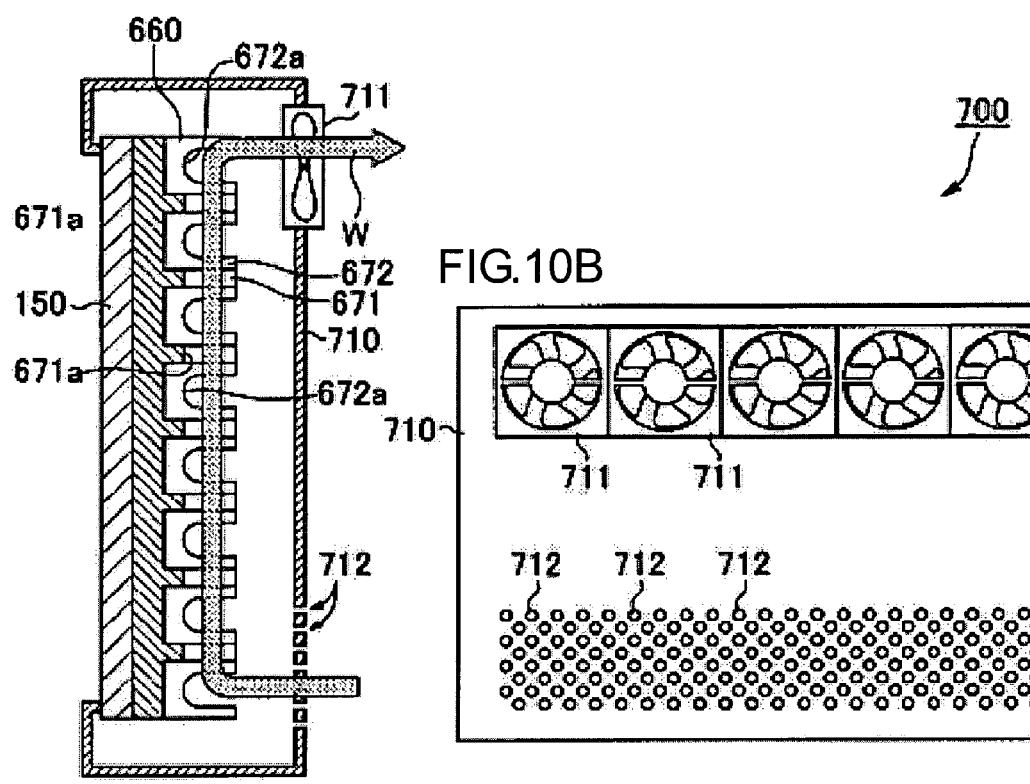
FIG. 10 is a perspective view illustrating the construction of an organic EL display device of a seventh embodiment.

FIG. 10(*a*) is a sectional side view of the organic EL display device 700 of the present embodiment in a state in which the organic EL display device 600 is accommodated in the chassis 710. FIG. 10(*b*) is a rear view of the organic EL display device 700. As shown in FIG. 10, the chassis 710 is formed substantially in the shape of a box having an opening for allowing the display surface of the organic EL panel 150 to be exposed to the front side (left side in FIG. 10(*a*) and backside in FIG. 10(*b*)). A plurality of fans (air intake means/air exhaust means) 711 are arranged on the back face of the chassis 710, and a large number of through-holes (air exhaust means/air intake means) 712 are formed therein.

The organic EL display device 600 is accommodated in the chassis 710 in a state in which the organic EL panel 150 is directed toward the outside and the reinforcing structure 660 is directed toward the fans 711. Also, during the operation of the organic EL display device 600, the fans 711 are operated to exhaust air, whereby ambient air is taken in from the through-holes 712 and is flowed through the cutout portions 671*a* continuously provided in the heat radiation member 670 on the backside of the display device, so that airflow W, as shown by an arrow in FIG. 10(*a*), discharged from the fans 711 is formed within the chassis. In this way, the heat of the heat radiation member 670 can be efficiently diffused to the outside from the fans 711.

Further, in the present embodiment, the vertical and horizontal beam members that constitute the heat radiation member 670 are provided with the cutout portions 671*a* and 672*a*. Thus, warm air can also be flowed to the right and left in FIG. 10(*b*) (in the vertical direction to the sheet plane of FIG. 10(*a*)) and the heat exhaust operation can be more efficiently performed.

In addition, the present embodiment illustrates the chassis 710 having a construction in which the fans 711 are arranged at the upper side of the back face of the chassis and a large number of the through-holes 712 are formed at the lower side of the back face of the chassis (refer to FIG. 10(*b*)). However, the fans 711 may be arranged at the lower side of the back face of the chassis and a large number of the through-holes 712 are formed at the upper side of the back face of the chassis. Even in that case, the fans 711 are operated to intake air, so that the ascending current similar to that in FIG. 10(*a*) may be formed within the chassis 710.

Further, an example in which an organic EL panel is used as the display panel has been described in the above respective embodiments. However, a liquid crystal panel or a display panel for which light emitting diode (LED) elements, inorganic electroluminescent elements, field emission light-emitting elements, or plasma emission elements are used can be preferably as the display panel.

(Electronic Apparatus)

Figure 7:
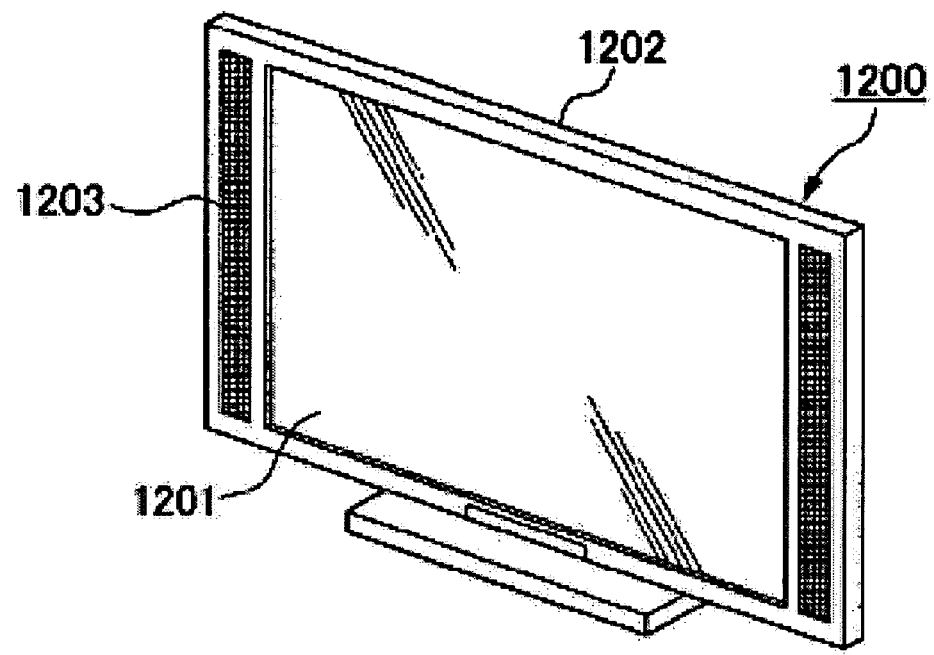
FIG. 7 is a perspective view illustrating the construction of an example of an electronic apparatus.

FIG. 7 is a perspective view illustrating an example of an electronic apparatus according to the present invention.

A video monitor 1200 shown in FIG. 7 comprises a display unit 1201 in which the organic EL display device of the above embodiments is installed in a chassis 1202, a speaker 1203, etc.

The display device of the above respective embodiments can be suitably used as image display means of a personal computer, a liquid crystal television, a workstation, a television telephone, etc. other than the image monitor. It is also possible to provide all such electronic apparatuses with a thin display unit having high reliability such as durability and heat radiation characteristics.

What is claimed is:

1. A display panel, wherein the reinforcing structure comprises a supporting substrate forming a part adhered to a back face of the display panel, and a heat radiation device having a display panel and a reinforcing structure provided on the backside of the display member provided on the supporting substrate, wherein the heat radiation member comprises a plurality of plate members arranged on the supporting substrate to intersect each other a such that the plate members are formed substantially in parallel crosses in plan view, and wherein the plurality of plate members are more densely arranged on the supporting substrate corresponding to a peripheral portion of the display panel.

2. The display device according to claim 1, wherein each of the plate members is provided with at least one heat radiation hole formed by cutting out part thereof.

3. The display device according to claim 2, wherein the at least one heat radiation hole is formed by cutting out the end of the plate member opposite to the supporting substrate.

4. The display device according to claim 1, wherein each of the plate members is provided with at least one heat radiation hole passing though a lateral face of the plate member.

5. The display device according to claim 2, wherein a plurality of the heat radiation holes are provided to permit communication between a plurality of regions on the supporting substrate defined by the plurality of plate members.

6. The display device according to claim 5, wherein the plurality of the heat radiation holes are provided to permit communication, in the vertical direction of the panel, between a plurality of regions on the supporting substrate defined by the plurality of plate members.

7. The display device according to claim 5, wherein the plurality of the heat radiation holes are provided to permit communication, in the horizontal direction of the panel, between a plurality of regions on the supporting substrate defined by the plurality of plate members.

8. The display device according to claim 6, wherein the plurality of the heat radiation holes that permit communication between the regions defined by the plurality of plate members are provided substantially at coaxial positions in side view in the corresponding communicating direction.

9. The display device according to claim 1, wherein heat radiation fins are provided on the supporting substrate.

10. The display device according to claim 9, wherein the heat radiation fins extend substantially parallel to a direction in which the plurality of the heat radiation holes are continuously provided, which permits communication between the regions on the supporting substrate defined by the plurality of plate members.

11. The display device according to claim 1, wherein the heat radiation member is made of metal.

12. The display device according to claim 1, wherein the display panel is a display panel comprising organic electroluminescent elements.

13. The display device according to claim 12, wherein the supporting substrate also serves as a sealing structure for the organic electroluminescent elements.

14. The display device according to claim 2, further comprising a chassis accommodating the display panel and the heat radiation member, wherein the chassis includes air supply means and air exhaust means arranged in close proximity to the heat radiation member, and the air supply means and the air exhaust means are arranged along the direction in which the heat radiation holes are continuously provided.

15. An electronic apparatus comprising the display device according to claim 1.

* * * * *